(12) United States Patent
Chiang

(10) Patent No.: US 8,907,712 B2
(45) Date of Patent: Dec. 9, 2014

(54) LEVEL SHIFTER CIRCUITS CAPABLE OF DEALING WITH EXTREME INPUT SIGNAL LEVEL VOLTAGE DROPS AND COMPENSATING FOR DEVICE PVT VARIATION

(75) Inventor: Chen-Feng Chiang, Xingang Township, Chiayi County (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 13/612,772

(22) Filed: Sep. 12, 2012

(65) Prior Publication Data

US 2013/0257505 A1 Oct. 3, 2013

Related U.S. Application Data

(60) Provisional application No. 61/616,036, filed on Mar. 27, 2012.

(51) Int. Cl.
*H03L 5/00* (2006.01)
*H03K 19/0185* (2006.01)
*H03K 3/356* (2006.01)

(52) U.S. Cl.
CPC .............. *H03L 5/00* (2013.01); *H03K 19/0185* (2013.01); *H03K 3/356113* (2013.01)
USPC ........................................................ 327/333

(58) Field of Classification Search
None
See application file for complete search history.

(56) References Cited

U.S. PATENT DOCUMENTS

| 6,850,090 | B2 | 2/2005 | Aoki | |
| 6,882,179 | B2* | 4/2005 | Knee | 326/83 |
| 2007/0085590 | A1* | 4/2007 | Wang | 327/333 |
| 2007/0210852 | A1* | 9/2007 | Imura | 327/333 |
| 2007/0247209 | A1* | 10/2007 | Chen | 327/333 |
| 2008/0246530 | A1* | 10/2008 | Morikawa | 327/333 |
| 2010/0052763 | A1* | 3/2010 | Chaba et al. | 327/333 |
| 2011/0032020 | A1* | 2/2011 | Campbell et al. | 327/333 |
| 2011/0095804 | A1* | 4/2011 | Kumar et al. | 327/333 |
| 2011/0109369 | A1* | 5/2011 | Benzer | 327/333 |
| 2012/0013386 | A1* | 1/2012 | Kumar et al. | 327/333 |
| 2012/0068755 | A1* | 3/2012 | Yamamoto et al. | 327/333 |
| 2012/0194256 | A1* | 8/2012 | Chen | 327/333 |
| 2013/0038375 | A1* | 2/2013 | Lin et al. | 327/333 |
| 2013/0154713 | A1* | 6/2013 | Wang | 327/333 |
| 2013/0257505 | A1* | 10/2013 | Chiang | 327/333 |

* cited by examiner

*Primary Examiner* — Lincoln Donovan
*Assistant Examiner* — Khareem E Almo
(74) *Attorney, Agent, or Firm* — McClure, Qualey & Rodack, LLP

(57) ABSTRACT

A level shifter circuit includes a level shifter unit and a first controlling unit. The level shifter unit has an input node for receiving an input signal having a predetermined level, an output node for outputting an output signal having a desired level and a complementary output node for outputting a complementary output signal complementary to the output signal. The first controlling unit is coupled to the level shifter unit and has a first transistor coupled between the complementary output node and a first control node for receiving a first control signal and a second transistor coupled between the input node for receiving the input signal and a ground.

21 Claims, 16 Drawing Sheets

LEVEL SHIFTER CIRCUITS CAPABLE OF DEALING WITH EXTREME INPUT SIGNAL LEVEL VOLTAGE DROPS AND COMPENSATING FOR DEVICE PVT VARIATION

CROSS REFERENCE TO RELATED APPLICATIONS

This application claims the benefit of U.S. Provisional Application No. 61/616,036 filed Mar. 27, 2012 and entitled "Level Shifter Design". The entire contents of which are hereby incorporated by reference.

BACKGROUND OF THE INVENTION

1. Field of the Invention

The invention relates to a level shifter, and more particularly to a level shifter capable of dealing with extreme input signal level voltage drops and compensating for device PVT variation.

2. Description of the Related Art

A level shifter is used to convert an input signal defined relative to a first reference voltage into an output signal defined relative to a second reference voltage. A typical level shifter receives the input signal via a pair of transistors. However, when extreme input signal level voltage drops occur, the capability of driving the transistors becomes weak and circuit latency increases. Moreover, the extreme voltage drop may further cause undesired duty cycle variation of the output signal, or even cause the level shifter to function fail because the input transistor cannot be turned on by the extreme low input signal.

To solve the problems, a novel level shifter design capable of dealing with extreme input signal level voltage drops and further compensating for device PVT variation is desired.

BRIEF SUMMARY OF THE INVENTION

Level shifter circuits are provided. An exemplary embodiment of a level shifter circuit comprises a level shifter unit and a first controlling unit. The level shifter unit comprises an input node for receiving an input signal having a predetermined level, an output node for outputting an output signal having a desired level and a complementary output node for outputting a complementary output signal complementary to the output signal. The first controlling unit is coupled to the level shifter unit and comprises a first transistor coupled between the complementary output node and a first control node for receiving a first control signal and a second transistor coupled between the input node for receiving the input signal and a ground.

Another exemplary embodiment of a level shifter circuit comprises a level shifter unit, a first controlling unit and a second controlling unit. The level shifter unit comprises an input node for receiving an input signal having a predetermined level, an output node for outputting an output signal having a desired level and a complementary output node for outputting a complementary output signal complementary to the output signal. The first controlling unit is coupled between the input node and the complementary output node and comprises a first transistor string having two transistors coupled in serial. The second controlling unit is coupled between the complementary input node and the output node and comprises a second transistor string having two transistors coupled in serial.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
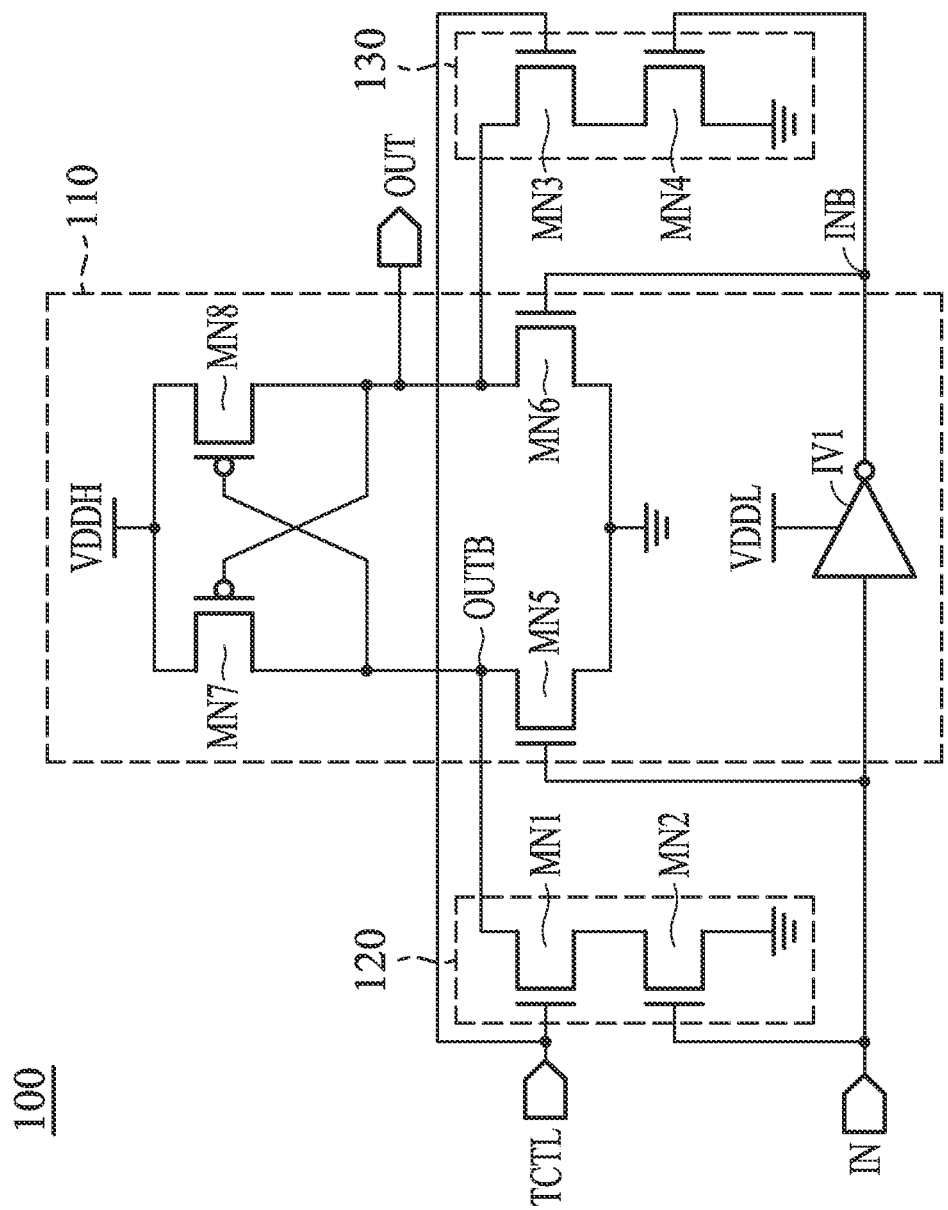
FIG. 1 shows a level shifter circuit according to an embodiment of the invention.

FIG. 1 shows a level shifter circuit according to an embodiment of the invention. According to an embodiment of the invention, the level shifter circuit 100 may comprise a level shifter unit 110, and controlling units 120 and 130 coupled to the level shifter unit 110. The level shifter unit 110 may comprise an input node IN for receiving an input signal having a predetermined level, an output node OUT for outputting an output signal having a desired level and a complementary output node OUTB for outputting a complementary output signal complementary to the output signal. The level shifter unit 110 may comprise a pair of transistors MN5 and MN6 at the input stage and respectively be coupled to the input node IN and a complementary input node INB for receiving the input signal and a signal complementary to the input signal (hereinafter called a complementary input signal). The level shifter unit 110 may further comprise a pair of cross-coupled transistors MN7 and MN8 at the output stage and respectively be coupled to the output node OUT and the complementary output node OUTB for outputting the output signal and a signal complementary to the output signal (hereinafter called a complementary output signal). In addition, the level shifter unit 110 may further comprise an inverter IV1 coupled between the input node IN and the complementary input node INB for generating the complementary input signal.

In the embodiment as shown in FIG. 1, the level shifter unit 110 is a low to high level shifter receiving the input signal having the predetermined level (for example, from 0 to VDDL volt) and shifting up the input signal level to generate the output signal having the desired level (for example, from 0 to VDDH volt), where the VDDL may be the low operating voltage of the whole system and the VDDH may be the high operating voltage of the whole system. The VDDL may also be an internal operating voltage utilized within a chip of the system and the VDDH may be an external operating voltage higher than VDDL and utilized outside of the chip.

According to an embodiment of the invention, the controlling units 120 and 130 may provide extra enhancing paths to enhance the driving capability of the transistors MN5 and MN6 at the input stage of the level shifter unit 110. The controlling unit 120 may be coupled between the input node IN and complementary output node OUTB and may comprise a transistor string having two transistors MN1 and MN2 coupled in serial. The controlling unit 130 may be coupled between the complementary input node INB and output node OUT and may comprise a transistor string having two transistors MN3 and MN4 coupled in serial.

According to an embodiment of the invention, the transistor MN1 may be coupled to the complementary output node OUTB and comprise a gate coupled to a control node TCTL for receiving a control signal therefrom, and the transistor MN2 may be coupled between the transistor MN1 and the ground and comprise a gate coupled to the input node IN for receiving the input signal therefrom. Similarly, the transistor MN3 may be coupled to the output node OUT and comprise a gate coupled to the control node TCTL for receiving the control signal therefrom, and the transistor MN4 may be coupled between the transistor MN3 and the ground and comprise a gate coupled to the input node INB for receiving the complementary input signal therefrom. In this embodiment, only one extra control pin (or called control finger) is required.

The control signal input to the control node TCTL may be utilized to enable or disable the enhancing function of the controlling units 120 and 130. When the transistors MN1 and MN3 are turned on in response to the control signal, the enhancing function is enabled. To be more specific, when the enhancing function is enabled and when the transistor MN2 or MN4 is turned on in response to the input signal, an extra enhancing path of pulling the voltage at the complementary output node OUTB or the output node OUT to the ground is presented. In this manner, even when extreme input signal level voltage drops occur, which may cause the driving capability of the transistor MN5 or MN6 to be reduced, the voltage at the complementary output node OUTB or the output node OUT may still be quickly pulled down to the ground through the transistor string in the controlling unit 120 or 130. The extreme voltage drop may occur when, for example, the voltage source for outputting VDDL is heavily toggled by other device(s) in the system. When extreme voltage drop occurs, the input signal voltage may be changed from an ideal level (for example, 1.2V) to an undesired level (for example, 0.8V). Therefore, the problems of increased circuit latency, undesired duty cycle variation of the output signal, and function fail of the level shifter due to the weak driving capability of the input transistors of the level shifter as discussed above, or due to the process, voltage or temperature (PVT) variation of the device(s) in the level shifter, may be solved by enabling the enhancing function.

The transistors in the level shifter circuit 100 as shown in FIG. 1 may be a thick-oxide transistor or a thin-oxide transistor, depending on the required operating voltage. For example, in a preferred embodiment, the transistors MN1, MN3, MN5, MN6, MN7 and MN8 may be a thick-oxide transistor, and the transistors MN2 and MN4 may be a thin-oxide transistor. To be more specific, when the transistors MN1~MN8 are all implemented by normal devices, the transistors MN1, MN3, MN5, MN6, MN7 and MN8 may be the I/O devices, and the transistors MN2 and MN4 may be the core devices. Note that the core devices may have lower operating voltages, thinner oxides and higher operating speeds than the I/O devices. In addition, note that in other embodiments of the invention, the transistors MN2 and MN4 may also be the thick-oxide transistor, such as the I/O devices as described above. Therefore, the invention should not be limited thereto.

In addition, note that in a preferred embodiment of the invention, only two extra transistors are required in each enhancing path and the control signal received from the control node TCTL may be designed in the VDDL domain. Because the control signal received from the control node TCTL has the predetermined level as the input signal, there is no need to introduce an extra level shifter for the control signal. Moreover, the concept of introducing extra enhancing path(s) in the level shifter circuit may further be applied to different level shifter architectures, different controlling unit architectures, and may also be applied to the high to low level shifters. Therefore, the invention should not be limited to the embodiment and modifications as illustrated above. The embodiments showing various modifications and arrangements are further illustrated in the following paragraphs.

Figure 2:
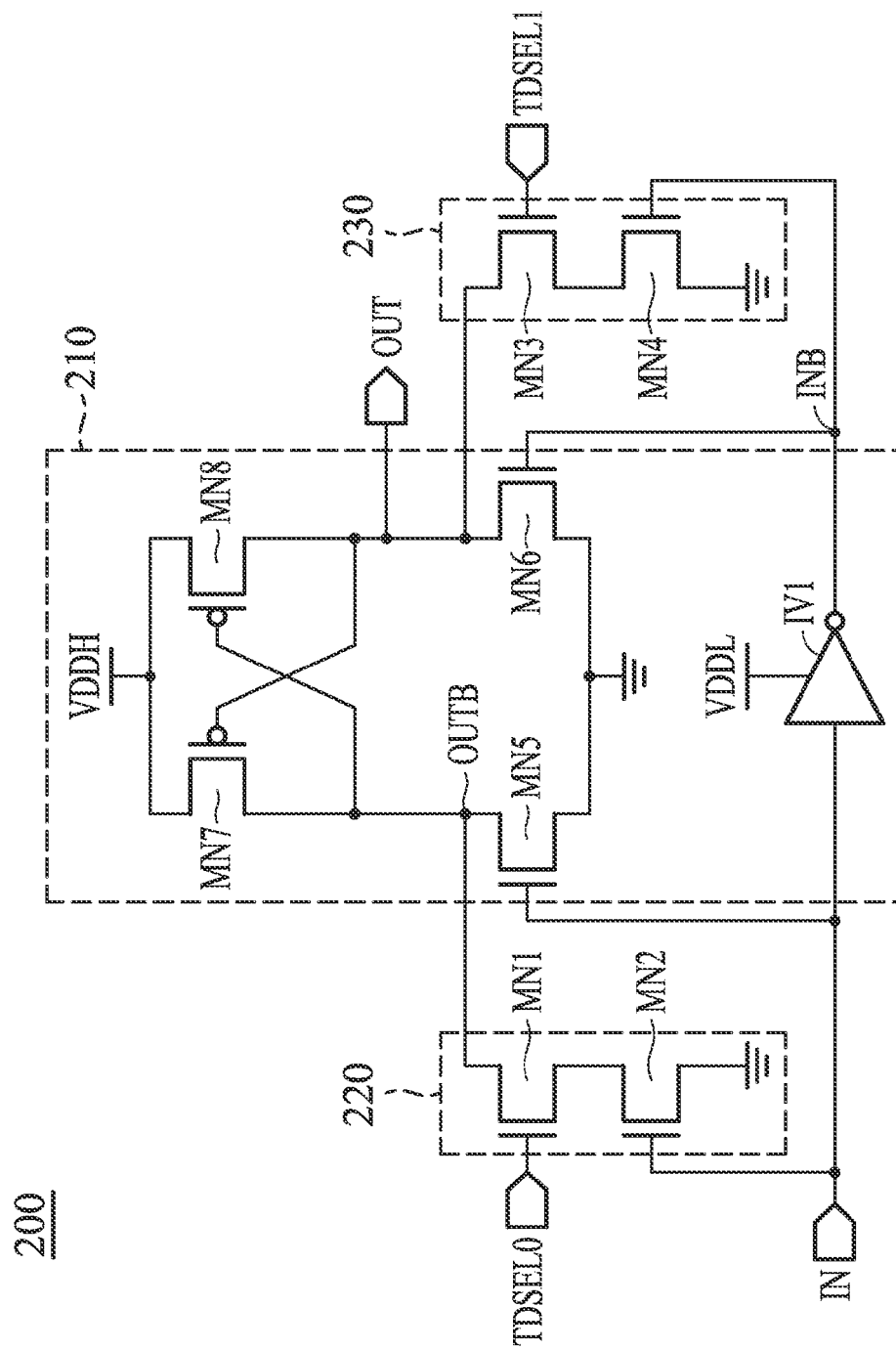
FIG. 2 shows a level shifter circuit according to another embodiment of the invention.

FIG. 2 shows a level shifter circuit according to yet another embodiment of the invention. The level shifter circuit 200 may comprise a level shifter unit 210, and controlling units 220 and 230 coupled to the level shifter unit 210. The level shifter circuit 200 has a similar structure as the level shifter circuit 100, and the only difference is that the transistors MN1 and MN3 are respectively coupled to different control nodes TDSEL0 and TDSEL1 for receiving the same or different control signals therefrom. Therefore, in this embodiment, the extra enhancing paths provided by the controlling units 220 and 230 may be collectively or individually controlled (that is, enabled or disabled) by the same or different control signals.

Note that in the embodiment of the invention, the duty cycle of the output signal may be flexibly adjusted by controlling the enable/disable period of the controlling units 220 and 230. For example, by increasing the enable time of the controlling unit 220 (to be more specific, increasing the ON time of the transistor MN1 via the control signal received from the control node TDSEL0), the high pulse width in the output signal is accordingly increased because the transistor MN8 can be quickly turned on via the enhancing path provided by the controlling unit 220. On the other hand, by increasing the enable time of the controlling unit 230, the low pulse width in the output signal is accordingly increased because the transistor MN7 can be quickly turned on via the enhancing path provided by the controlling unit 230. Therefore, by adjusting the enable/disable period of the controlling units 220 and 230, the duty cycle of the output signal may be adjusted, accordingly.

Since the duty cycle of the output signal may be flexibly adjusted by controlling the enable/disable period of the controlling units 220 and 230, the proposed level shifter circuit 200 may further fit the multi-voltage of VDDH or VDDL applications. For example, the level shifter circuit 200 may adopt different levels of VDDH from 1.5V, 1.8V, 2.5V, 2.8V to 3.3V. The higher level of VDDH may result in stronger driving capabilities of the transistors MN7 and MN8 and therefore, longer high pulse widths in the output signal may be presented. To balance between the high pulse width and low pulse width, a designer may increase the enable time of the controlling unit 230 by controlling the level of the control signal received from the control node TDSEL1 to turn on the transistor MN3 longer so as to increase the low pulse width in the output signal.

Note that in a preferred embodiment of the invention, the control signals received from the control nodes TDSEL0 and TDSEL1 may be designed in the VDDL domain. Because the control signals received from the control nodes TDSEL0 and TDSEL1 have the predetermined level as the input signal, there is no need to introduce an extra level shifter for the control signal.

Figure 3:
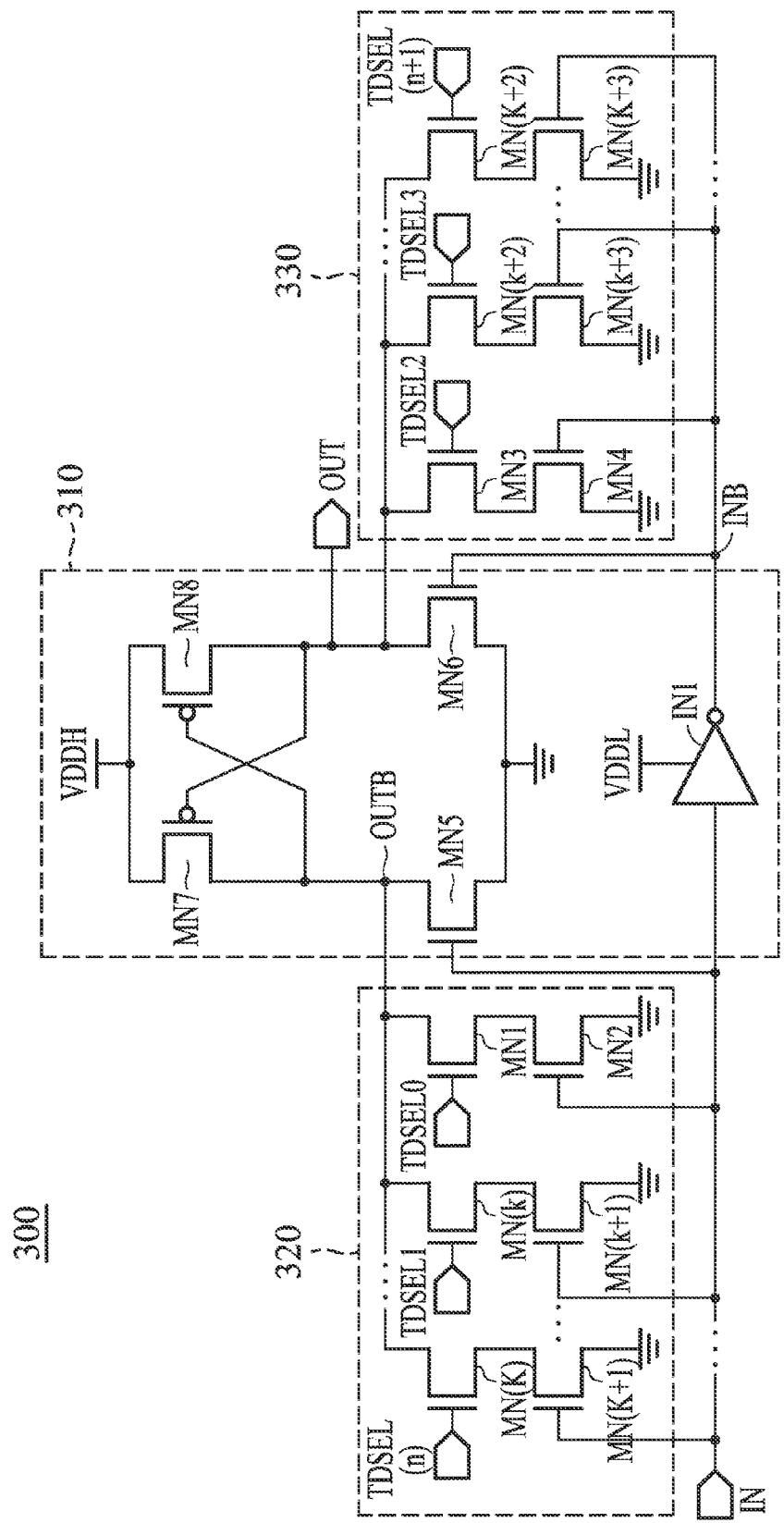
FIG. 3 shows a level shifter circuit according to yet another embodiment of the invention.

FIG. 3 shows a level shifter circuit according to yet another embodiment of the invention. The level shifter circuit 300 may comprise a level shifter unit 310, and controlling units 320 and 330 coupled to the level shifter unit 310. The level shifter circuit 300 has a similar structure as the level shifter circuit 200. Differences are that the controlling units 320 and 330 comprise multiple transistor strings coupled in parallel between the complementary output node OUTB and the input node IN and between the output node OUT and the complementary input node INB.

As shown in FIG. 3, the controlling unit 320 may comprise transistor strings MN1 and MN2, MN(k) and MN(k+1) . . . and MN(K) and MN(K+1), and the controlling unit 330 may comprise transistor strings MN3 and MN4, MN(k+2) and MN(k+3) . . . and MN(K+2) and MN(K+3), where k and K are positive integers. In addition, there are multiple control nodes TDSEL0, TDSEL1, TDSEL2, TDSEL3 . . . TDSEL(n) and TDSEL(n+1), each coupled to one transistor string for enabling or disabling the corresponding enhancing path, where n is a positive integer.

In the embodiment of the invention, the duty cycle of the output signal may also be flexibly adjusted by individually controlling the enable/disable period of each enhancing path in the controlling units 320 and 330 in a similar way as described above. In addition, in the embodiment, the transistor size may be flexibly designed in each enhancing path. For example, the size of the transistors MN(k) and MN(k+1) may be double the size of the transistors MN1 and MN2. Therefore, the enhancing capability in each enhancing path may be differently weighted. In this manner, the duty cycle of the output signal may be adjusted more flexibly than the embodiment shown in FIG. 2 by enabling one or more enhancing path(s) with the same or different weightings as required. In addition, the adjustment step size may be finer than the embodiment shown in FIG. 2.

Note that in a preferred embodiment of the invention, the control signals received from the control nodes TDSEL0, TDSEL1, TDSEL2, TDSEL3 . . . TDSEL(n) and TDSEL(n+1) may be designed in the VDDL domain. Because the control signals received from the control nodes TDSEL0, TDSEL1, TDSEL2, TDSEL3 . . . TDSEL(n) and TDSEL(n+1) have the predetermined level as the input signal, there is no need to introduce an extra level shifter for the control signal.

Figure 4:
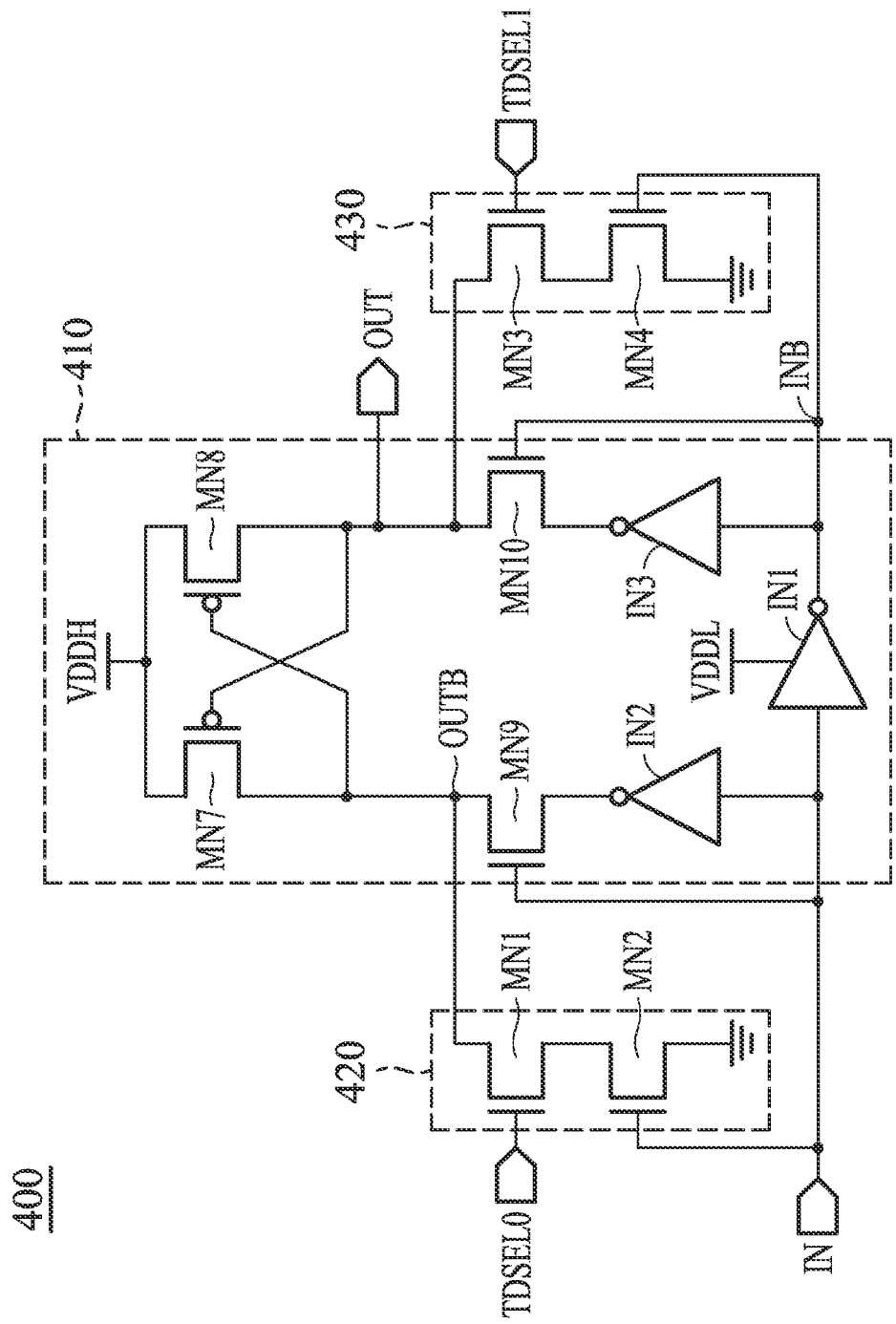
FIG. 4 shows a level shifter circuit according to yet another embodiment of the invention.

As previously described, the concept of introducing extra enhancing path(s) in the level shifter circuit may further be applied to different level shifter architectures. FIG. 4 shows a level shifter circuit according to yet another embodiment of the invention. The level shifter circuit 400 may comprise a level shifter unit 410, and controlling units 420 and 430 coupled to the level shifter unit 410. The level shifter circuit 400 has a similar structure as the level shifter circuit 200. Differences are that the level shifter unit 410 has a different structure from the level shifter unit 210. As compared to the level shifter unit 210, the level shifter unit 410 may further comprise two inverters IN2 and IN3. The inverter IN2 may be coupled between the input node IN and the input transistor MN9 of the level shifter unit 410. The inverter IN3 may be coupled between the complementary input node INB and the input transistor MN10 of the level shifter unit 410. According to an embodiment of the invention, the transistors MN9 and MN10 may be the thick-oxide transistors. Note that the controlling units 420 and 430 may also be designed as the controlling units 120 and 130, the controlling units 320 and 330, and various modifications thereof as previously described. Therefore, the invention should not be limited thereto. For descriptions concerning the operations of the level shifter circuit 400, reference may be made to the introductions of the level shifter circuits shown in FIG. 1 to FIG. 3 as illustrated above, and are omitted here for brevity.

Figure 5:
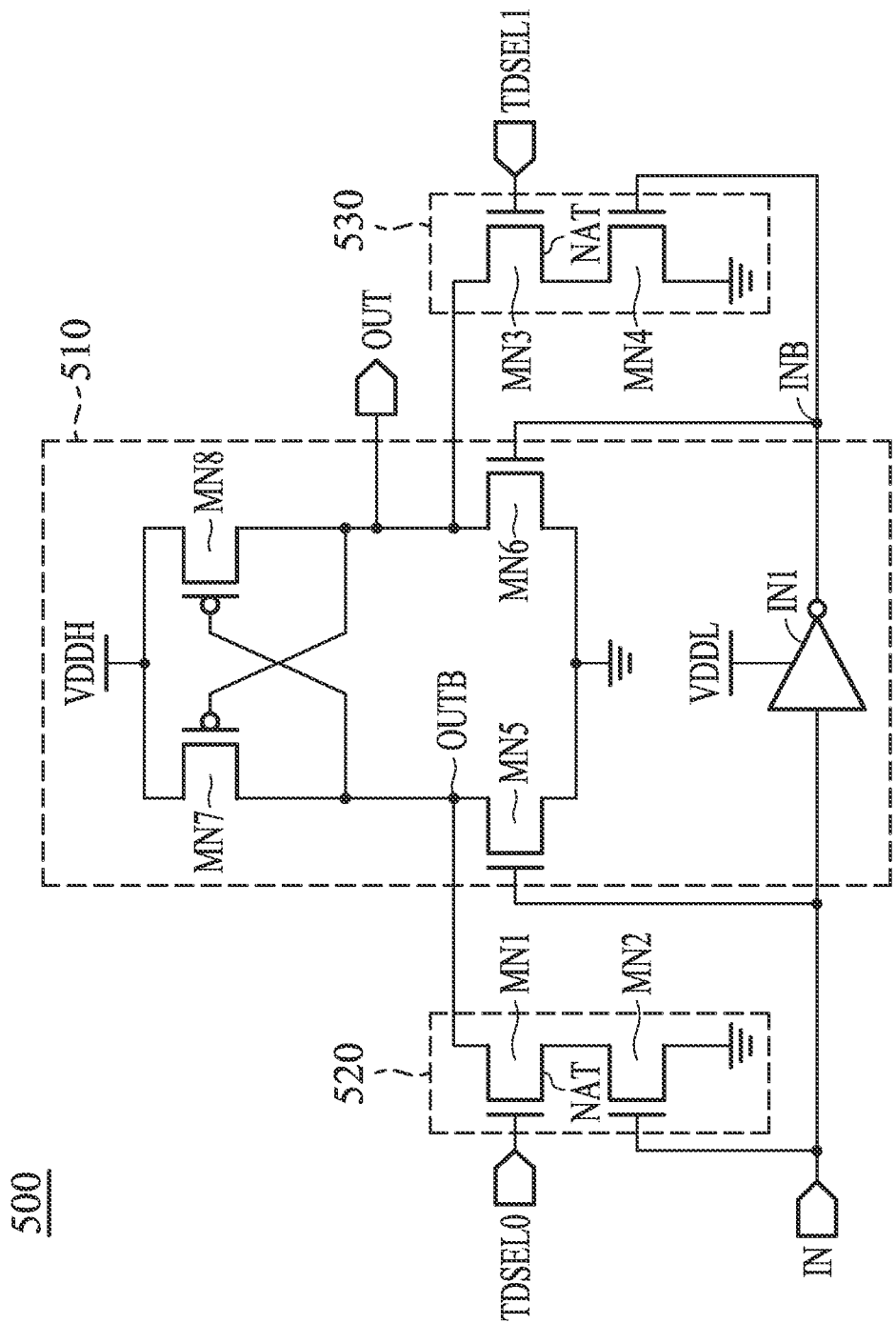
FIG. 5 shows a level shifter circuit according to yet another embodiment of the invention.

FIG. 5 shows a level shifter circuit according to yet another embodiment of the invention. The level shifter circuit 500 may comprise a level shifter unit 510, and controlling units 520 and 530 coupled to the level shifter unit 510. The level shifter circuit 500 has a similar structure as the level shifter circuit 200. Differences are that the transistors MN1 and MN3 may be selected as native devices (labeled by "NAT"), such as thick-oxide native devices. The native device has a short gate length, a small nearly zero threshold voltage, and is relatively fast as compared to a normal device. Therefore, the turn on speed of the transistors MN1 and MN3 shown in FIG. 5 may be faster than that of the transistor MN1 and MN3 shown in FIG. 2. Note that the controlling units 520 and 530 may also be designed as the controlling units 120 and 130, the controlling units 320 and 330, and various modifications thereof, with the I/O devices in the controlling units being replaced by the native devices. Therefore, the invention should not be limited thereto. For descriptions concerning the operations of the level shifter circuit 500, reference may be made to the introductions of the level shifter circuits shown in FIG. 1 to FIG. 3 as illustrated above, and are omitted here for brevity.

Figure 6:
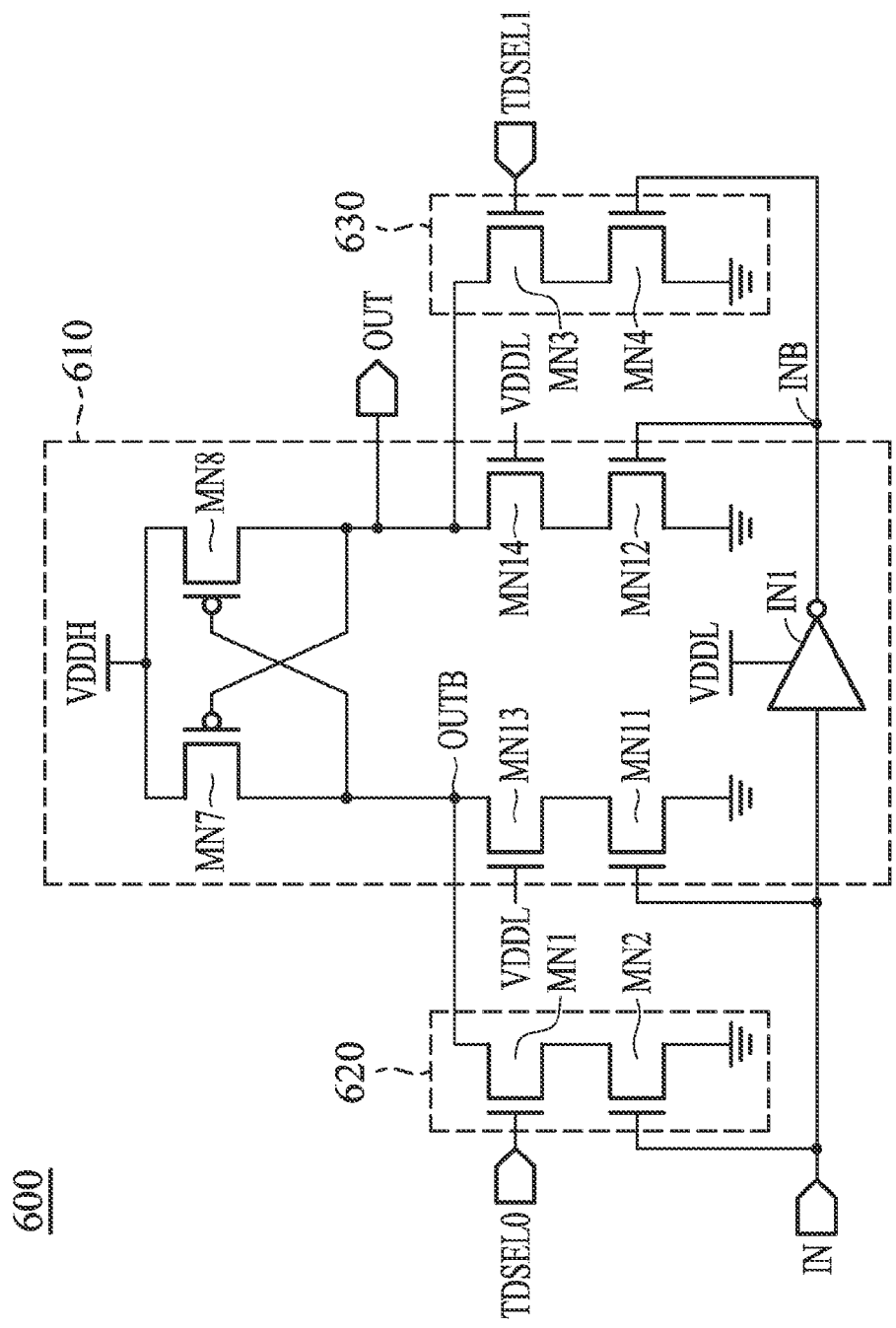
FIG. 6 shows a level shifter circuit according to yet another embodiment of the invention.

FIG. 6 shows a level shifter circuit according to yet another embodiment of the invention. The level shifter circuit 600 may comprise a level shifter unit 610, and controlling units 620 and 630 coupled to the level shifter unit 610. The level shifter circuit 600 has a similar structure as the level shifter circuit 200. Differences are that the level shifter unit 610 has a different structure from the level shifter unit 210. As compared to the level shifter unit 210, the level shifter unit 610 may comprise two transistors MN13 and MN14 coupled between the input stage and the output stage. The transistor MN13 may be coupled between the complementary output node OUTB and the input transistor MN11 of the level shifter unit 610 and may comprise a gate for receiving the operating voltage VDDL. The transistor MN14 may be coupled between the output node OUT and the input transistor MN12 of the level shifter unit 610 and may comprise a gate for receiving the operating voltage VDDL. According to an embodiment of the invention, the transistors MN11 and MN12 may be the thin-oxide transistors, and the transistors MN13 and MN14 may be the thick-oxide transistors.

Note that the controlling units 620 and 630 may also be designed as the controlling units 120 and 130, the controlling units 320 and 330, the controlling units 520 and 530, and various modifications thereof as previously described. Therefore, the invention should not be limited thereto. For descriptions concerning the operations of the level shifter circuit 600, reference may be made to the introductions of the level shifter circuits shown in FIG. 1 to FIG. 3 as illustrated above, and are omitted here for brevity.

Figure 7:
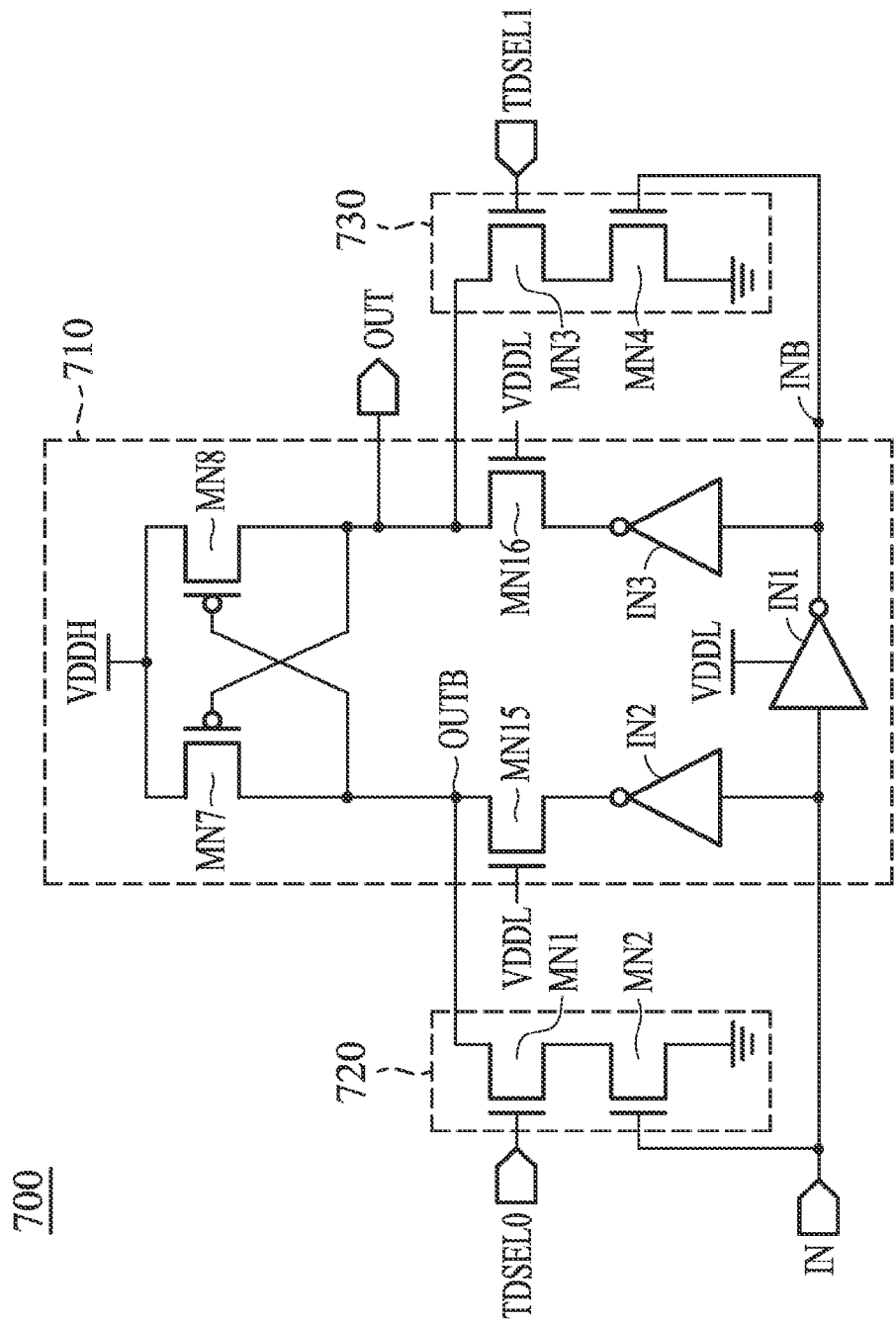
FIG. 7 shows a level shifter circuit according to yet another embodiment of the invention.

FIG. 7 shows a level shifter circuit according to yet another embodiment of the invention. The level shifter circuit 700 may comprise a level shifter unit 710, and controlling units 720 and 730 coupled to the level shifter unit 710. The level shifter circuit 700 has a similar structure as the level shifter circuit 400. Differences are that the input transistors MN15 and MN16 in the level shifter unit 710 are coupled to the voltage VDDL instead of the input node IN and the complementary input node INB. Note that the controlling units 720 and 730 may also be designed as the controlling units 120 and 130, the controlling units 320 and 330, the controlling units 520 and 530 and various modifications thereof as previously described. Therefore, the invention should not be limited thereto. For descriptions concerning the operations of the level shifter circuit 700, reference may be made to the introductions of the level shifter circuits shown in FIG. 1 to FIG. 3 as illustrated above, and are omitted here for brevity.

Figure 8:
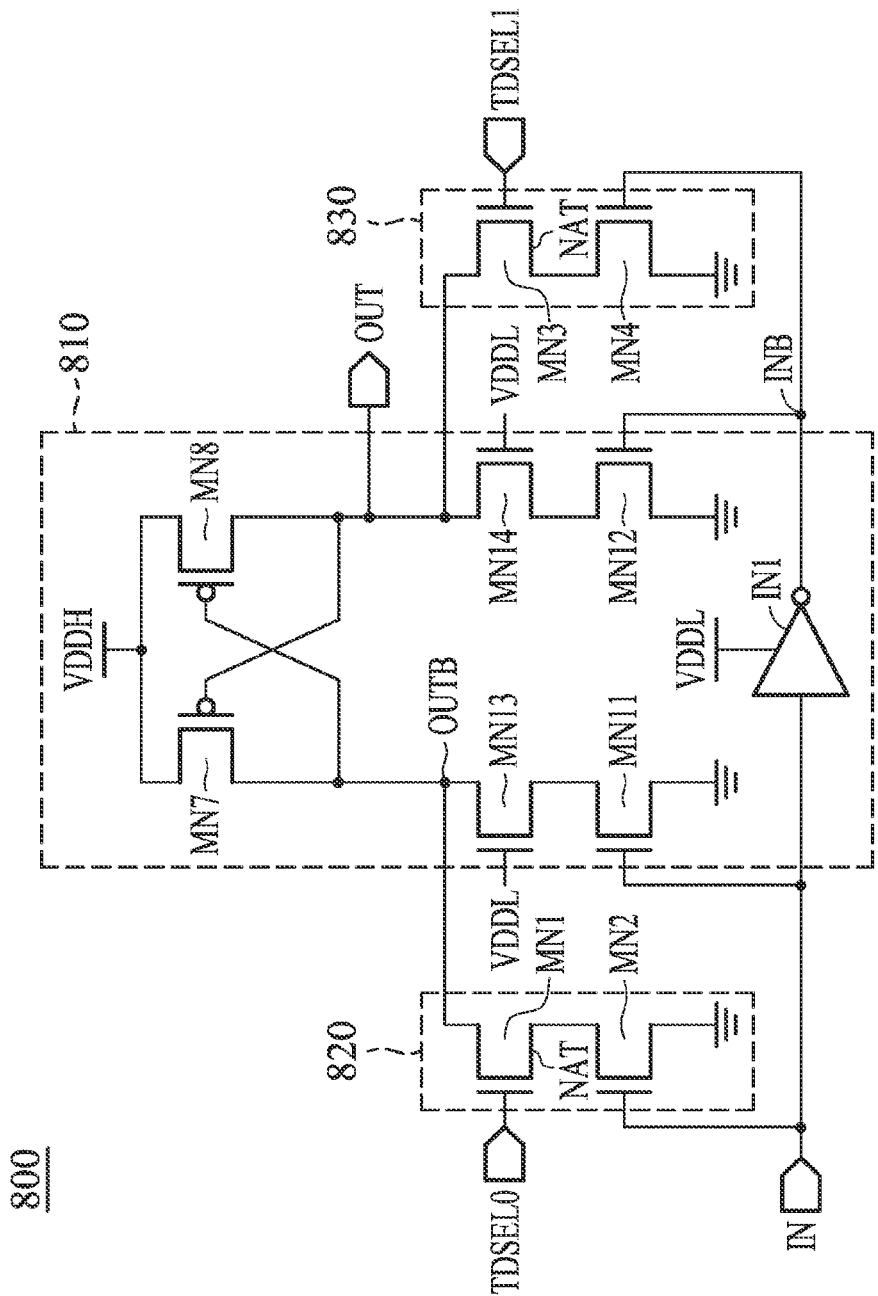
FIG. 8 shows a level shifter circuit according to yet another embodiment of the invention.

FIG. 8 shows a level shifter circuit according to yet another embodiment of the invention. The level shifter circuit 800 may comprise a level shifter unit 810, and controlling units 820 and 830 coupled to the level shifter unit 810. The level shifter circuit 800 has a similar structure as the level shifter circuit 600. Differences are that the transistors MN1 and MN2 coupled to the output nodes OUT and complementary output node OUTB of the level shifter unit 810 in the controlling units 820 and 830 are selected as native devices (labeled by "NAT"), such as thick-oxide native devices. Note that the controlling units 820 and 830 may also be designed as the controlling units 120 and 130, the controlling units 220 and 230, the controlling units 320 and 330 and various modifications thereof as previously described. Therefore, the invention should not be limited thereto. For descriptions concerning the operations of the level shifter circuit 800, reference may be made to the introductions of the level shifter circuits shown in FIG. 1 to FIG. 3 as illustrated above, and are omitted here for brevity.

Figure 9:
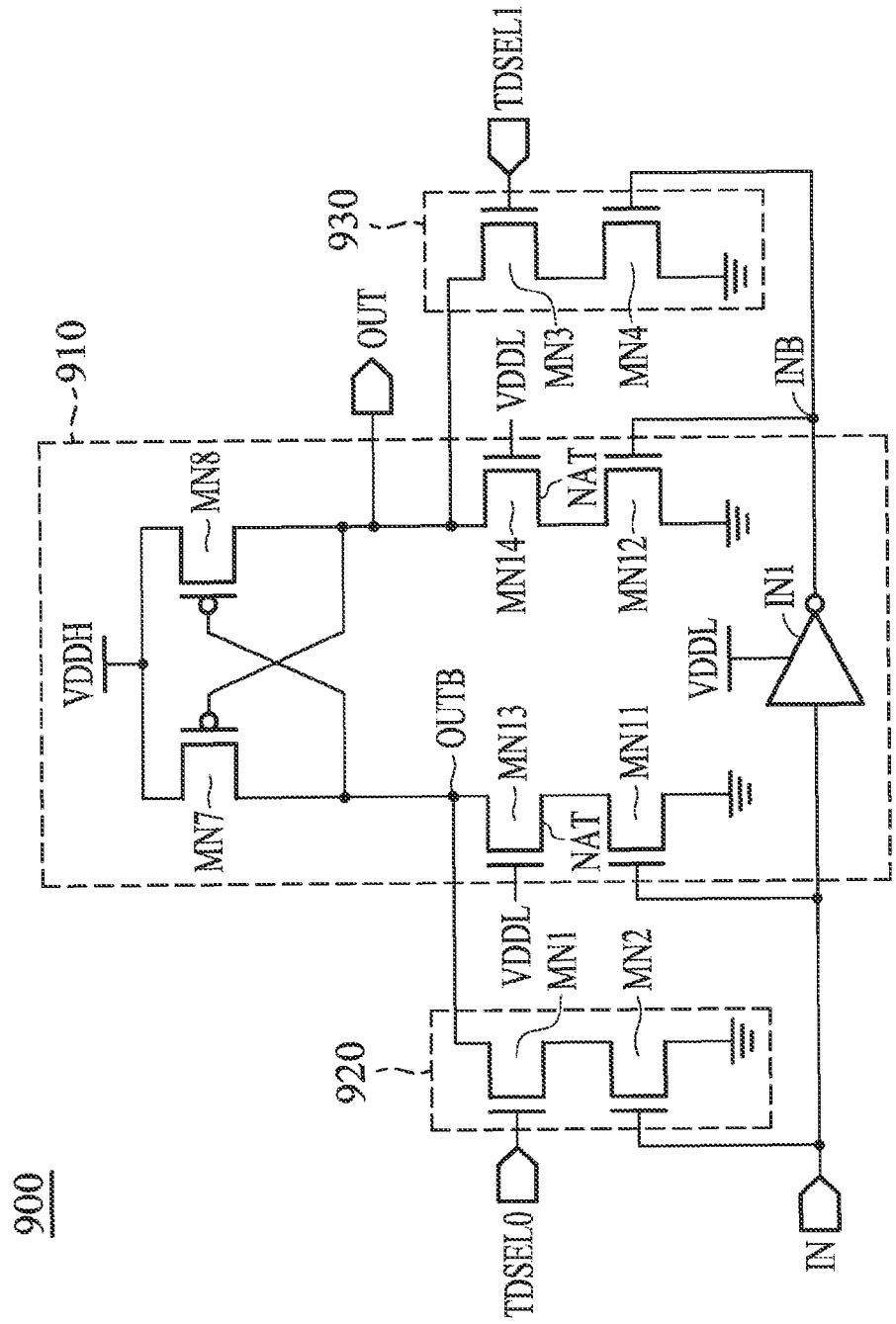
FIG. 9 shows a level shifter circuit according to yet another embodiment of the invention.

FIG. 9 shows a level shifter circuit according to yet another embodiment of the invention. The level shifter circuit 900 may comprise a level shifter unit 910, and controlling units 920 and 930 coupled to the level shifter unit 910. The level shifter circuit 900 has a similar structure as the level shifter circuit 600. Differences are that the transistors MN13 and MN14 coupled to the output nodes OUT and complementary output node OUTB and the voltage VDDL in the level shifter unit 910 are selected as native devices (labeled by "NAT"), such as thick-oxide native devices. Note that the controlling units 920 and 930 may also be designed as the controlling units 120 and 130, the controlling units 220 and 230, the controlling units 320 and 330, the controlling units 520 and 330 and various modifications thereof as previously described. Therefore, the invention should not be limited thereto. For descriptions concerning the operations of the level shifter circuit 900, reference may be made to the introductions of the level shifter circuits shown in FIG. 1 to FIG. 3 as illustrated above, and are omitted here for brevity.

Figure 10:
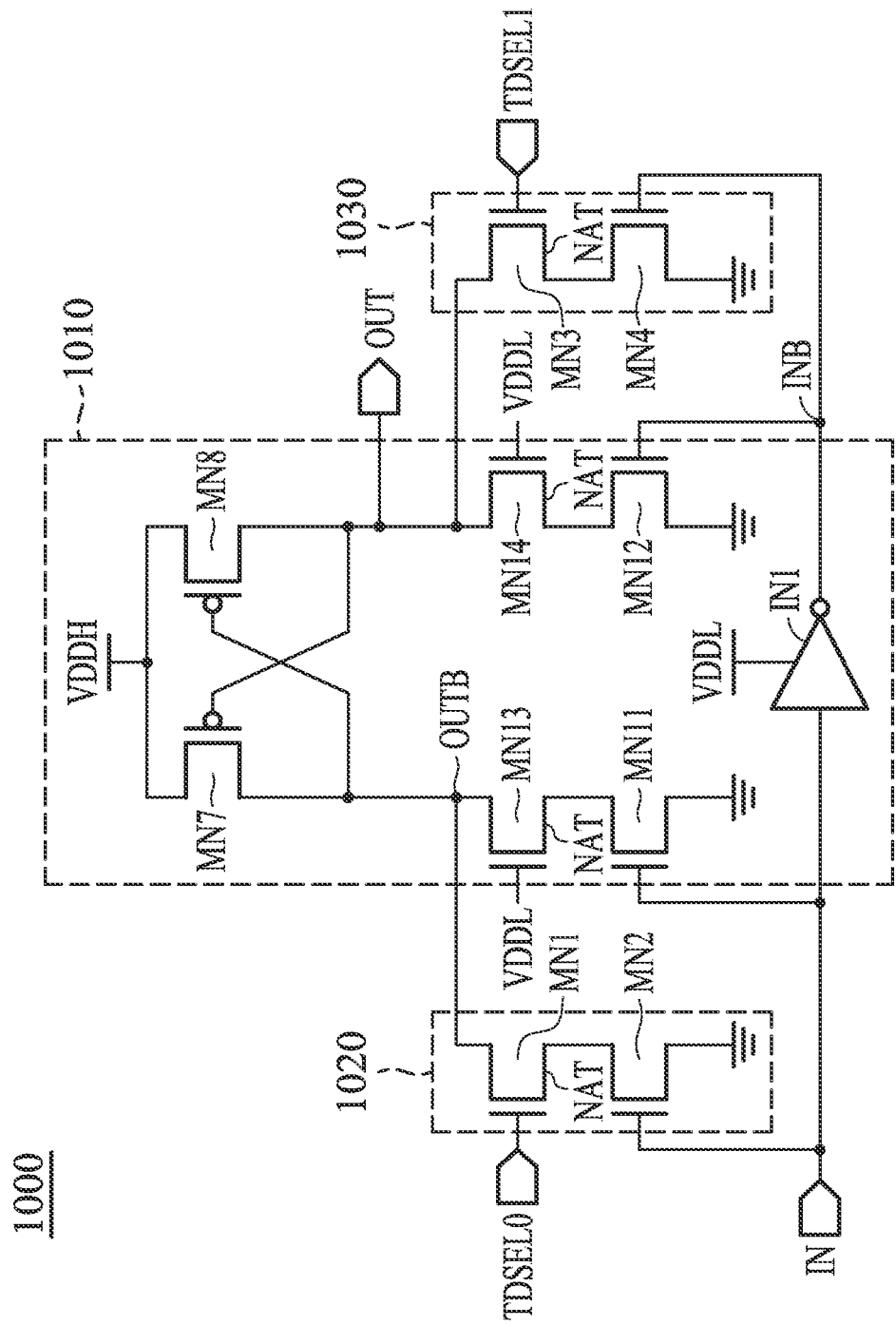
FIG. 10 shows a level shifter circuit according to yet another embodiment of the invention.

FIG. 10 shows a level shifter circuit according to yet another embodiment of the invention. The level shifter circuit 1000 may comprise a level shifter unit 1010, and controlling units 1020 and 1030 coupled to the level shifter unit 1010. The level shifter circuit 1000 has a similar structure as the level shifter circuit 900. Differences are that the transistors MN1 and MN2 coupled to the output nodes OUT and complementary output node OUTB of the level shifter unit 1010 in the controlling units 1020 and 1030 are selected as native devices (labeled by "NAT"), such as thick-oxide native devices. Note that the controlling units 1020 and 1030 may also be designed as the controlling units 120 and 130, the controlling units 220 and 230, the controlling units 320 and 330 and various modifications thereof as previously described. Therefore, the invention should not be limited thereto. For descriptions concerning the operations of the level shifter circuit 1000, reference may be made to the introductions of the level shifter circuits shown in FIG. 1 to FIG. 3 as illustrated above, and are omitted here for brevity.

Figure 11:
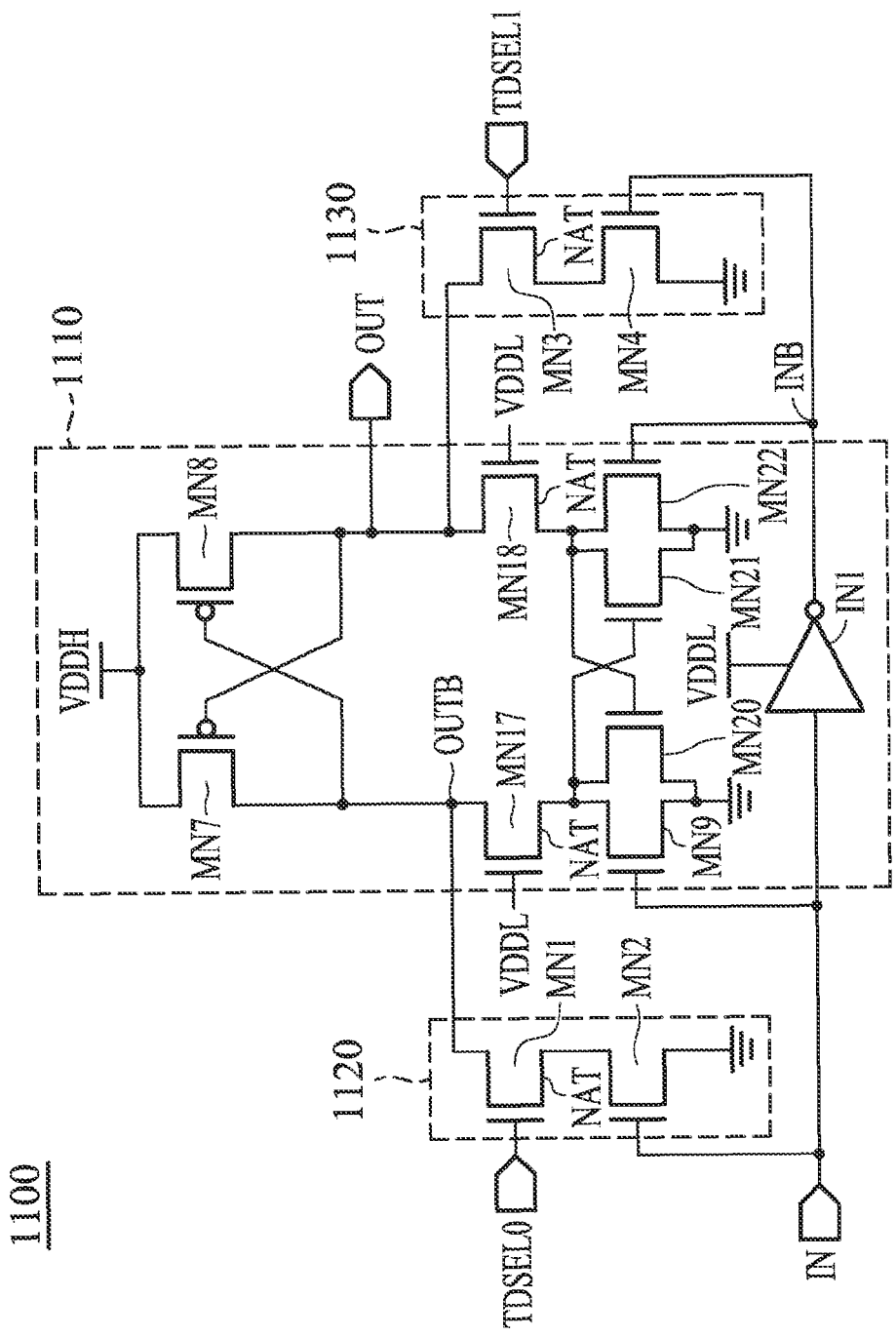
FIG. 11 shows a level shifter circuit according to yet another embodiment of the invention.

FIG. 11 shows a level shifter circuit according to yet another embodiment of the invention. The level shifter circuit 1100 may comprise a level shifter unit 1110, and controlling units 1120 and 1130 coupled to the level shifter unit 1110. The level shifter circuit 1100 has a similar structure as the level shifter circuit 1000. Differences are that the level shifter unit 1110 has a different structure from the level shifter unit 1010. As compared to the level shifter circuit 1000, the transistors MN17 and MN18 may be respectively coupled to the ground via the transistors MN19, MN20, MN21 and MN22. The transistors MN1, MN2, MN17 and MN18 coupled to the output nodes OUT and complementary output node OUTB of the level shifter unit 1110 in the controlling units 1120 and 1130 are selected as native devices (labeled by "NAT"), such as thick-oxide native devices.

Note that the controlling units 1120 and 1130 may also be designed as the controlling units 120 and 130, the controlling units 220 and 230, the controlling units 320 and 330 and various modifications thereof as previously described. Therefore, the invention should not be limited thereto. For descriptions concerning the operations of the level shifter circuit 1100, reference may be made to the introductions of the level shifter circuits shown in FIG. 1 to FIG. 3 as illustrated above, and are omitted here for brevity.

Figure 12:
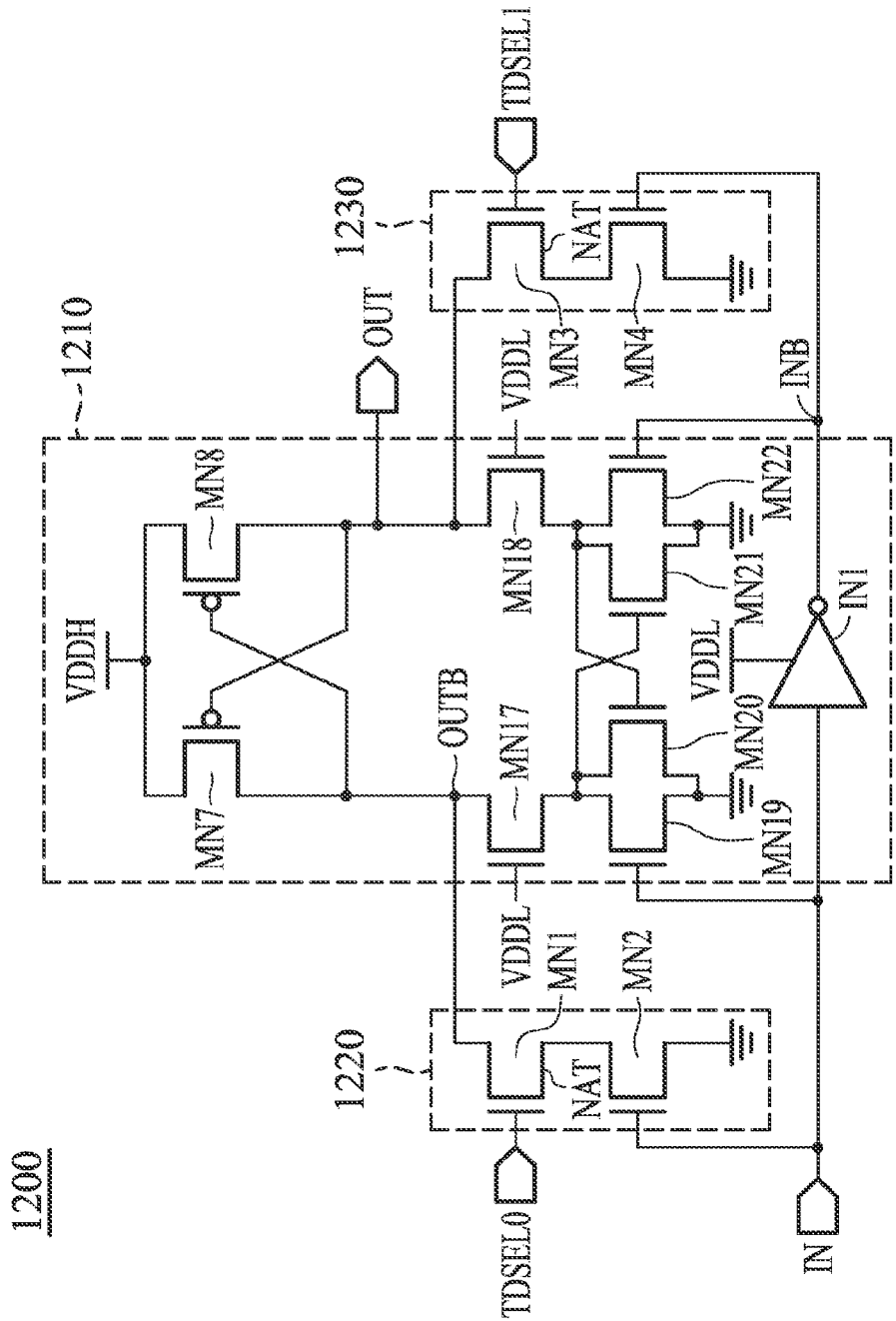
FIG. 12 shows a level shifter circuit according to yet another embodiment of the invention.

FIG. 12 shows a level shifter circuit according to yet another embodiment of the invention. The level shifter circuit 1200 may comprise a level shifter unit 1210, and controlling units 1220 and 1230 coupled to the level shifter unit 1210. The level shifter circuit 1200 has a similar structure as the level shifter circuit 1100. Differences are that the transistors MN17 and MN18 coupled to the output nodes OUT and complementary output node OUTB and the voltage VDDL in the level shifter unit 1210 are selected as normal thick-oxide transistors, such as I/O devices. Note that the controlling units 1220 and 1230 may also be designed as the controlling units 120 and 130, the controlling units 220 and 230, the controlling units 320 and 330 and various modifications thereof as previously described. Therefore, the invention should not be limited thereto. For descriptions concerning the operations of the level shifter circuit 1200, reference may be made to the introductions of the level shifter circuits shown in FIG. 1 to FIG. 3 as illustrated above, and are omitted here for brevity.

Figure 13:
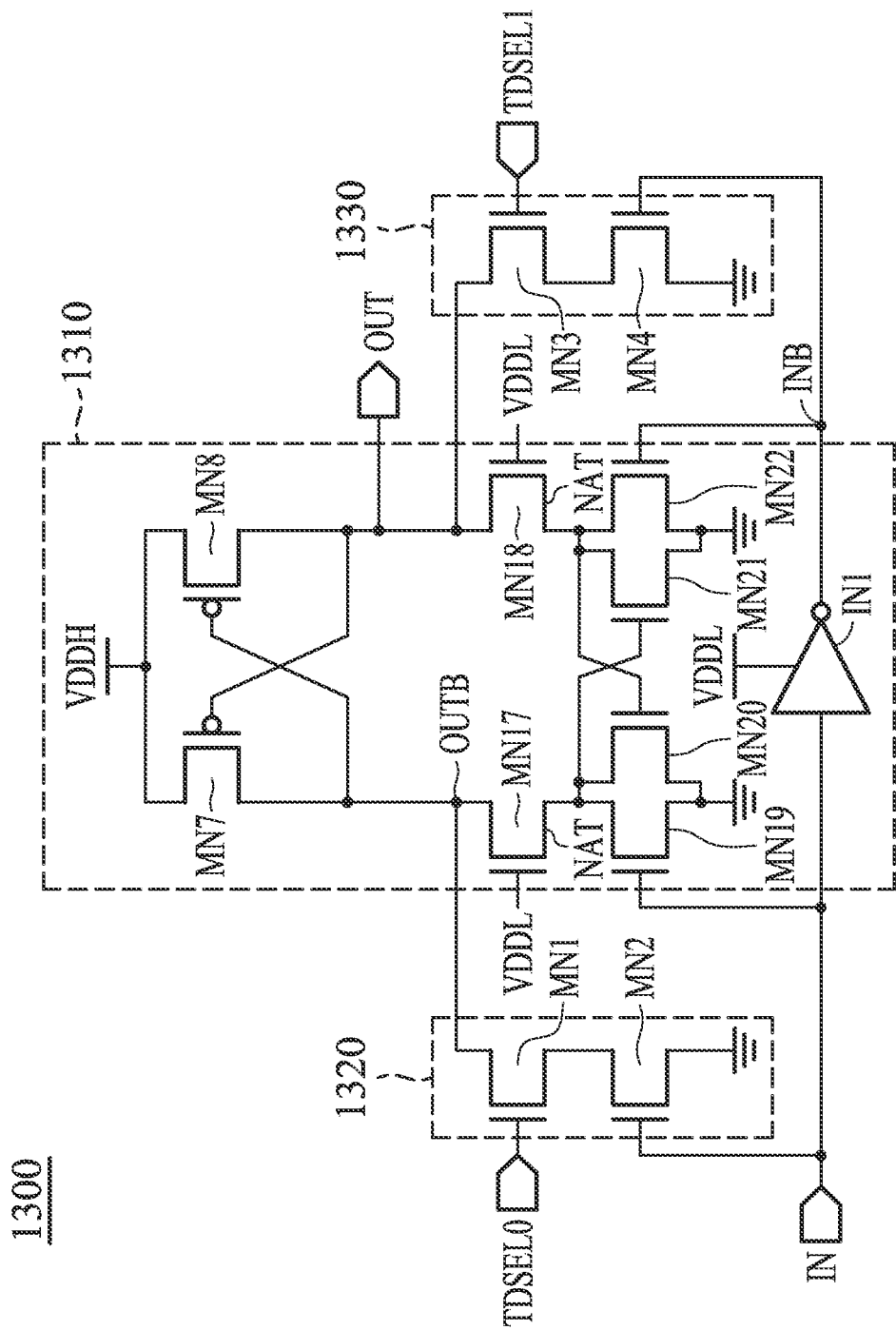
FIG. 13 shows a level shifter circuit according to yet another embodiment of the invention.

FIG. 13 shows a level shifter circuit according to yet another embodiment of the invention. The level shifter circuit 1300 may comprise a level shifter unit 1310, and controlling units 1320 and 1330 coupled to the level shifter unit 1310. The level shifter circuit 1300 has a similar structure as the level shifter circuit 1100. Differences are that the transistors MN1 and MN2 coupled to the output nodes OUT and complementary output node OUTB in the controlling units 1320 and 1330 are selected as normal thick-oxide transistors, such as I/O devices. Note that the controlling units 1320 and 1330 may also be designed as the controlling units 120 and 130, the controlling units 220 and 230, the controlling units 320 and 330 and various modifications thereof as previously described. Therefore, the invention should not be limited thereto. For descriptions concerning the operations of the level shifter circuit 1300, reference may be made to the introductions of the level shifter circuits shown in FIG. 1 to FIG. 3 as illustrated above, and are omitted here for brevity.

Figure 14:
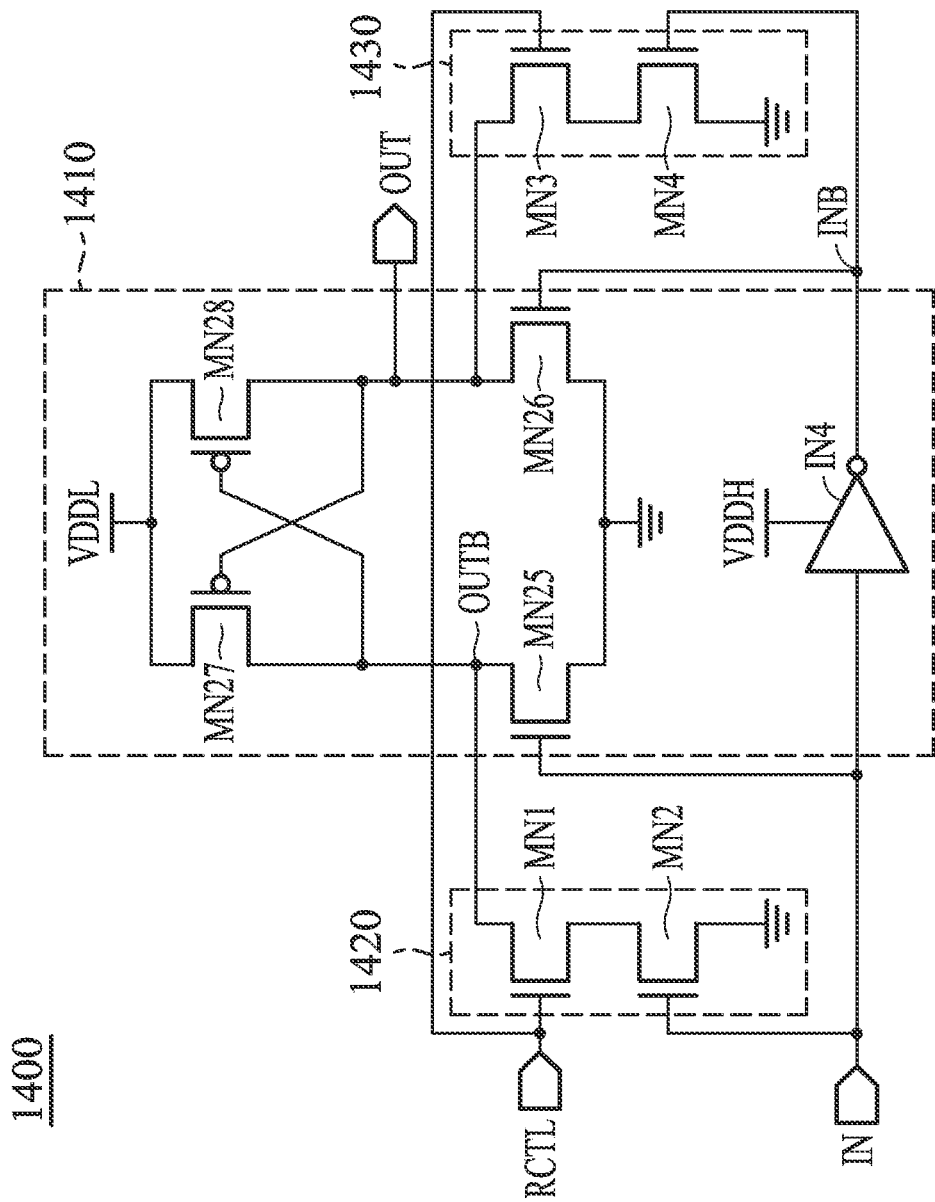
FIG. 14 shows a level shifter circuit according to yet another embodiment of the invention.

As described above, the concept of introducing extra enhancing path(s) in the level shifter circuit may further be applied to the high to low level shifter. FIG. 14 shows a level shifter circuit according to yet another embodiment of the invention. The level shifter circuit 1400 may comprise a level shifter unit 1410, and controlling units 1420 and 1430 coupled to the level shifter unit 1410. In the embodiment, the level shifter unit 1410 is a high to low level shifter receiving the input signal having the predetermined level (for example, from 0 to VDDH volt) and shifting down the input signal level to generate the output signal having the desired level (for example, from 0 to VDDL volt).

The level shifter unit 1410 may comprise an input node IN for receiving an input signal having a predetermined level, an output node OUT for outputting an output signal having a desired level and a complementary output node OUTB for outputting a complementary output signal complementary to the output signal. The level shifter unit 1410 may comprise a pair of transistors MN25 and MN26 at the input stage and respectively be coupled to the input node IN and a complementary input node INB for receiving the input signal and a complementary input signal. The level shifter unit 1410 may further comprise a pair of cross-coupled transistors MN27 and MN28 at the output stage and respectively be coupled to the output node OUT and the complementary output node OUTB for outputting the output signal and a complementary output signal. In addition, the level shifter unit 1410 may further comprise an inverter IV4 coupled between the input node IN and the complementary input node INB for generating the complementary input signal. Different from the low to high level shifter circuit 100 shown in FIG. 1, the inverter IN4 in the level shifter unit 1410 is coupled to the high operating voltage VDDH and may comprise at least one thick-oxide transistor. In addition, different from the low to high level shifter circuit 100 shown in FIG. 1, the pair of cross-coupled transistors MN27 and MN28 at the output stage may be coupled to the low operating voltage VDDL.

In addition, in a preferred embodiment, the transistors MN1, MN3, MN27 and MN28 may be a thin-oxide transistor, and the transistors MN2, MN4, MN25 and MN26 may be a thick-oxide transistor. To be more specific, when the transistors MN1~MN4 and MN25~MN28 are all implemented by normal devices, the transistors MN1, MN3, MN27 and MN28 may be the core devices, and the transistors MN2, MN4, MN25 and MN26 may be the I/O devices. Note that the core devices may have lower operating voltages, thinner oxides and higher operating speeds than the I/O devices. In addition, note that in other embodiments of the invention, the transistors MN1 and MN3 may also be the thick-oxide transistor, such as the I/O devices as described above. Therefore, the invention should not be limited thereto.

According to an embodiment of the invention, the transistor MN1 may be coupled to the complementary output node OUTB and comprise a gate coupled to a control node RCTL for receiving a control signal therefrom, and the transistor MN3 may be coupled to the output node OUT and comprise a gate coupled to the control node RCTL for receiving the control signal therefrom. In this embodiment, only one extra control pin (or called control finger) is required.

The control signal input to the control node RCTL may be utilized to enable or disable the enhancing function of the controlling units 1420 and 1430. When the transistors MN1 and MN3 are turned on in response to the control signal, the enhancing function is enabled. To be more specific, when the enhancing function is enabled and when the transistor MN2 or MN4 is turned on in response to the input signal, an extra enhancing path of pulling the voltage at the complementary output node OUTB or the output node OUT to the ground is presented. In this manner, even when extreme input signal level voltage drops occur, which may cause the driving capability of the transistor MN25 or MN26 to be reduced, the voltage at the complementary output node OUTB or the output node OUT may still be quickly pulled down to the ground through the transistor string in the controlling unit 1420 or 1430. The extreme voltage drop may occur when, for example, the voltage source for outputting VDDH is heavily toggled by other device(s) in the system. When extreme voltage drops occur, the input signal voltage may be changed from an ideal level (for example, 2.5V) to an undesired level (for example, 2.1V). Therefore, the problems of increased circuit latency, undesired duty cycle variation of the output signal, and function fail of the level shifter due to the weak driving capability of the input transistors in the level shifters as discussed above, or due to the process, voltage or temperature (PVT) variation of the device(s) in the level shifter, may be solved by enabling the enhancing function.

In addition, note that in a preferred embodiment of the invention, only two extra transistors are required in each enhancing path and the control signal received from the control node RCTL may be designed in the VDDL domain. Because the control signal received from the control node RCTL has the desired level as the output signal, there is no need to introduce an extra level shifter for the control signal. Moreover, the concept of introducing extra enhancing path(s) in the level shifter circuit may further be applied to different level shifter architectures, and different controlling unit architectures, as the low to high level shifter design as described above in FIG. 1-13. Therefore, the invention should not be limited to the embodiment and modifications as illustrated above.

Figure 15:
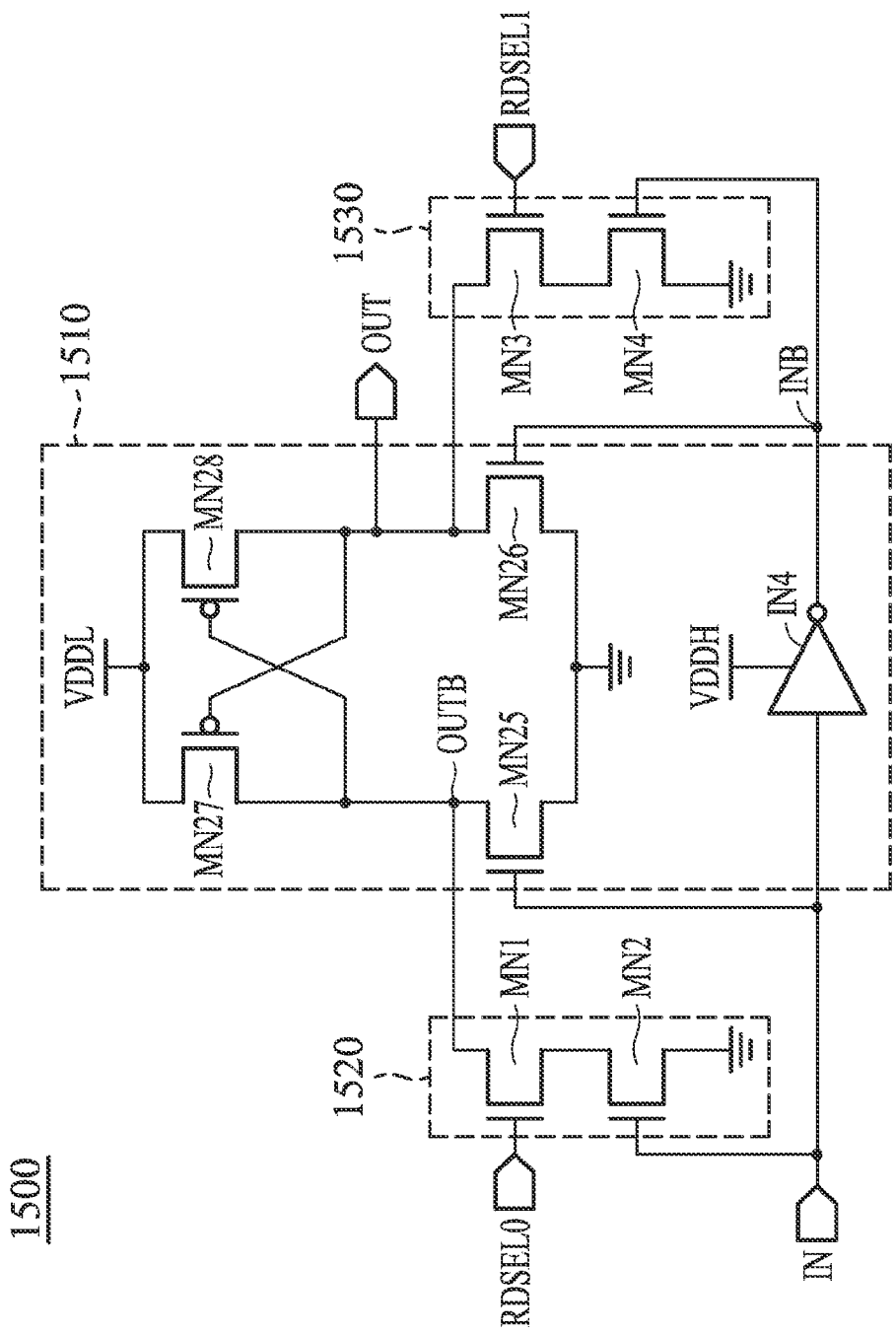
FIG. 15 shows a level shifter circuit according to yet another embodiment of the invention.

FIG. 15 shows a level shifter circuit according to yet another embodiment of the invention. The level shifter circuit 1500 may comprise a level shifter unit 1510, and controlling units 1520 and 1530 coupled to the level shifter unit 1510. The level shifter circuit 1500 has a similar structure as the level shifter circuit 1400, and the only difference is that the transistors MN1 and MN3 are respectively coupled to different control nodes RDSEL0 and RDSEL1 for receiving the same or different control signals therefrom. Therefore, in this embodiment, the extra enhancing paths provided by the controlling units 1520 and 1530 may be collectively or individually controlled (that is, enabled or disabled) by the same or different control signals.

Note that in the embodiment of the invention, the duty cycle of the output signal may be flexibly adjusted by controlling the enable/disable period of the controlling units 1520 and 1530. For example, by increasing the enable time of the controlling unit 1520 (to be more specific, increasing the ON time of the transistor MN1 via the control signal received from the control node RDSEL0), the high pulse width in the output signal is accordingly increased because the transistor MN28 can be quickly turned on via the enhancing path provided by the controlling unit 1520. On the other hand, by increasing the enable time of the controlling unit 1530, the low pulse width in the output signal is accordingly increased because the transistor MN27 can be quickly turned on via the enhancing path provided by the controlling unit 1530. Therefore, by adjusting the enable/disable period of the controlling units 1520 and 1530, the duty cycle of the output signal may be adjusted, accordingly.

Since the duty cycle of the output signal may be flexibly adjusted by controlling the enable/disable period of the controlling units 1520 and 1530, the proposed level shifter circuit 1500 may further fit the multi-voltage of VDDH or VDDL applications as previously described. Note that in a preferred embodiment of the invention, the control signals received from the control nodes RDSEL0 and RDSEL1 may be designed in the VDDL domain. Because the control signals received from the control nodes RDSEL0 and RDSEL1 have the desired level as the output signal, there is no need to introduce an extra level shifter for the control signal.

Figure 16:
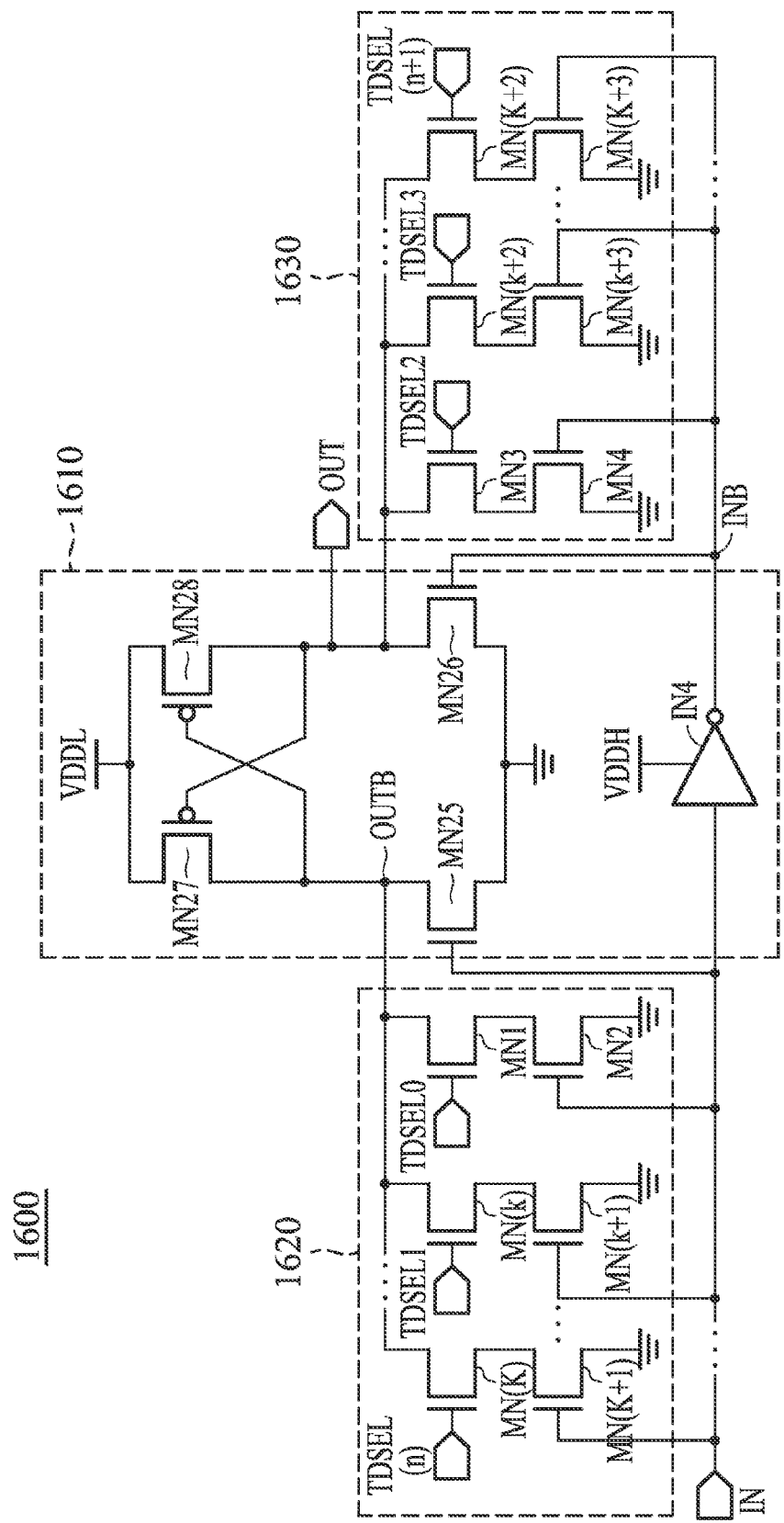
FIG. 16 shows a level shifter circuit according to yet another embodiment of the invention.

FIG. 16 shows a level shifter circuit according to yet another embodiment of the invention. The level shifter circuit 1600 may comprise a level shifter unit 1610, and controlling units 1620 and 1630 coupled to the level shifter unit 1610. The level shifter circuit 1600 has a similar structure as the level shifter circuit 1500. Differences are that the controlling units 1620 and 1630 comprise multiple transistor strings coupled in parallel between the complementary output node OUTB and the input node IN and between the output node OUT and the complementary input node INB.

As shown in FIG. 16, the controlling unit 1620 may comprise transistor strings MN1 and MN2, MN(k) and MN(k+1) . . . and MN(K) and MN(K+1), and the controlling unit 1630 may comprise transistor strings MN3 and MN4, MN(k+2) and MN(k+3) . . . and MN(K+2) and MN(K+3), where k and K are a positive integers. In addition, there are multiple control nodes RDSEL0, RDSEL1, RDSEL2, RDSEL3 . . . RDSEL(n) and RDSEL(n+1), each coupled to one transistor string for enabling or disabling the corresponding enhancing path, where n is a positive integer.

In the embodiment of the invention, the duty cycle of the output signal may also be flexibly adjusted by individually controlling the enable/disable period of each enhancing path in the controlling units 1520 and 1530 in a similar way as described above. In addition, in the embodiment, the transistor size may be flexibly designed in each enhancing path.

For example, transistors MN(k) and MN(k+1) may have double size as compared to the transistors MN1 and MN2. Therefore, the enhancing capability in each enhancing path may be differently weighted. In this manner, the duty cycle of the output signal may be adjusted more flexibly than the embodiment shown in FIG. 15 by enabling one or more enhancing path(s) with the same or different weightings as required. In addition, the adjustment step size may be finer than the embodiment shown in FIG. 15.

Note that in a preferred embodiment of the invention, the control signals received from the control nodes RDSEL0, RDSEL1, RDSEL2, RDSEL3 . . . RDSEL(n) and RDSEL(n+1) may be designed in the VDDL domain. Because the control signals received from the control nodes RDSEL0, RDSEL1, RDSEL2, RDSEL3 . . . RDSEL(n) and RDSEL(n+1) have the desired level as the output signal, there is no need to introduce an extra level shifter for the control signal.

In addition, note that various modifications as illustrated in FIG. 4 to FIG. 13 for a low to high level shifter circuit may also be applied to the high to low level shifter circuit as shown in FIG. 14 to FIG. 16. Those skilled in the art can easily derive some other different embodiments of the high to low level shifter circuit based on the understanding of the circuits as illustrated in FIG. 4 to FIG. 13, and the relative drawings and descriptions of those modifications are omitted here for brevity.

While the invention has been described by way of various examples and in terms of preferred embodiment, it is to be understood that the invention is not limited to FIG. 1 to FIG. 16. To the contrary, it is intended to cover various modifications and similar arrangements (as would be apparent to those skilled in the art) in which the extra enhancing path(s) are coupled to the high to low or low to high level shifter unit for enhancing the driving capability thereof. Therefore, the scope of the appended claims should be accorded the broadest interpretation so as to encompass all such modifications and similar arrangements.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A level shifter circuit, comprising:
   a level shifter unit, comprising an input node for receiving an input signal having a predetermined level, an output node for outputting an output signal having a desired level and a complementary output node for outputting a complementary output signal complementary to the output signal, wherein the level shifter unit further comprises a pair of input transistors and wherein at least one of the input transistors is coupled to the input node for receiving the input signal;
   a first controlling unit, coupled to the level shifter unit and comprising:
   a first transistor, coupled between the complementary output node and a first control node for receiving a first control signal; and
   a second transistor, coupled to the input node for receiving the input signal and coupled to a ground.

2. The level shifter circuit as claimed in claim 1, wherein the first transistor and the second transistor are coupled in serial.

3. The level shifter circuit as claimed in claim 1, further comprising:
   a second controlling unit, coupled to the level shifter unit and comprising:
   a third transistor, coupled between the output node and the first control node for receiving the first control signal; and
   a fourth transistor, coupled between a complementary input node of the level shifter unit for receiving a complementary input signal complementary to the input signal and the ground.

4. The level shifter circuit as claimed in claim 1, further comprising:
   a second controlling unit, coupled to the level shifter unit and comprising:
   a third transistor, coupled between the output node and a second control node for receiving a second control signal; and a fourth transistor, coupled between a complementary input node of the level shifter unit for receiving a complementary input signal complementary to the input signal and the ground.

5. The level shifter circuit as claimed in claim 4, wherein the first controlling unit further comprises:
   a fifth transistor, coupled between the complementary output node and a third control node for receiving a third control signal; and
   a sixth transistor, coupled between the first input node for receiving the input signal and the ground, and
   wherein the second controlling unit further comprises:
   a seventh transistor, coupled between the output node and a fourth control node for receiving a fourth control signal; and
   an eighth transistor, coupled between the complementary input node for receiving the complementary input signal and the ground.

6. The level shifter circuit as claimed in claim 5, wherein the first transistor and the second transistor are coupled in serial, the third transistor and the fourth transistor are coupled in serial, the fifth transistor and the sixth transistor are coupled in serial and the seventh transistor and the eighth transistor are coupled in serial.

7. The level shifter circuit as claimed in claim 1, wherein when the level shifter unit is a low to high level shifter, the first transistor is a thick-oxide transistor and when the level shifter unit is a high to low level shifter, the second transistor is a thick-oxide transistor.

8. The level shifter circuit as claimed in claim 7, wherein the thick-oxide transistor is an I/O device or a native device.

9. The level shifter circuit as claimed in claim 7, wherein when the level shifter unit is a low to high level shifter, the second transistor is a thin-oxide transistor and when the level shifter unit is a high to low level shifter, the first transistor is a thin-oxide transistor.

10. The level shifter circuit as claimed in claim 1, wherein when the level shifter unit is a low to high level shifter, the first control signal has the predetermined level and when the level shifter unit is a high to low level shifter, the first control signal has the desired level.

11. A level shifter circuit, comprising:
   a level shifter unit, comprising an input node for receiving an input signal having a predetermined level, a complementary input node, an output node for outputting an output signal having a desired level and a complementary output node for outputting a complementary output signal complementary to the output signal, wherein the level shifter unit further comprises a pair of input transistors, one of the input transistors is coupled to the input node for receiving the input signal and the other of the input transistors is coupled to the complementary input node for receiving a complementary input signal complementary to the input signal;
   a first controlling unit, coupled between the input node and the complementary output node and comprising a first transistor string having two transistors coupled in serial; and
   a second controlling unit, coupled between the complementary input node and the output node and comprising a second transistor string having two transistors coupled in serial.

12. The level shifter circuit as claimed in claim 11, wherein the first transistor string comprises:
   a first transistor, coupled to the complementary output node; and
   a second transistor, coupled between the first transistor and a ground, and
   wherein the second transistor string comprises:
   a third transistor, coupled to the output node; and
   a fourth transistor, coupled between the third transistor and the ground, and
   wherein the first transistor comprises a gate coupled to a first control node for receiving a first control signal and the second transistor comprises a gate coupled to the input node for receiving the input signal.

13. The level shifter circuit as claimed in claim 12, wherein the third transistor comprises a gate coupled to the first control node for receiving the first control signal and the fourth transistor comprises a gate coupled to the complementary input node for receiving the complementary input signal.

14. The level shifter circuit as claimed in claim 12, wherein the third transistor comprises a gate coupled to a second control node for receiving a second control signal and the fourth transistor comprises a gate coupled to the complementary input node for receiving the complementary input signal.

15. The level shifter circuit as claimed in claim 11, wherein the first controlling unit further comprises one or more third transistor string(s) each having two transistors coupled in serial, and wherein the first transistor string and the third transistor string(s) are coupled in parallel between the input node and the complementary output node.

16. The level shifter circuit as claimed in claim 11, wherein the second controlling unit further comprises one or more fourth transistor string(s) each having two transistors coupled in serial, wherein the second transistor string and the fourth transistor string(s) are coupled in parallel between the complementary input node and the output node.

17. The level shifter circuit as claimed in claim 12, wherein when the level shifter unit is a low to high level shifter, the first transistor and the third transistor are thick-oxide transistors and when the level shifter unit is a high to low level shifter, the second transistor and the fourth transistor are thick-oxide transistors.

18. The level shifter circuit as claimed in claim 17, wherein the thick-oxide transistor is an I/O device or a native device.

19. The level shifter circuit as claimed in claim 17, wherein when the level shifter unit is a low to high level shifter, the second transistor and the fourth transistor are thin-oxide transistors and when the level shifter unit is a high to low level shifter, the first transistor and the third transistor are thin-oxide transistors.

20. The level shifter circuit as claimed in claim 17, wherein when the level shifter unit is a low to high level shifter, the second transistor and the fourth transistor are core devices and when the level shifter unit is a high to low level shifter, the first transistor and the third transistor are a core device.

21. The level shifter circuit as claimed in claim 12, wherein when the level shifter unit is a low to high level shifter, the first control signal has the predetermined level and when the level shifter unit is a high to low level shifter, the first control signal has the desired level.

* * * * *